United States Patent
Sanders

(10) Patent No.: US 6,696,850 B1
(45) Date of Patent: Feb. 24, 2004

(54) CONTACT PROBE WITH OFF-CENTERED BACK-DRILLED APERTURE

(75) Inventor: David L. Sanders, Camden Point, MO (US)

(73) Assignee: Interconnect Devices, Inc., Kansas City, KS (US)

(*) Notice: Subject to any disclaimer, the term of this patent is extended or adjusted under 35 U.S.C. 154(b) by 0 days.

(21) Appl. No.: 10/266,263

(22) Filed: Oct. 2, 2002

(51) Int. Cl.[7] .............................. G01R 31/02
(52) U.S. Cl. .................. 324/761; 324/754; 324/158.1
(58) Field of Search ................. 324/761, 754, 324/758, 158.1, 765, 725; 439/482, 66

(56) References Cited

U.S. PATENT DOCUMENTS

| | | | |
|---|---|---|---|
| 5,175,493 A | | 12/1992 | Langgard |
| 5,506,515 A | | 4/1996 | Godshalk et al. |
| 5,801,544 A | | 9/1998 | Swart et al. |
| 5,850,147 A | * | 12/1998 | Stowers et al. .......... 324/761 |
| 5,897,326 A | | 4/1999 | Eldridge et al. |
| 6,104,205 A | | 8/2000 | Mawby |
| 6,218,848 B1 | | 4/2001 | Hembree et al. |
| 6,222,280 B1 | | 4/2001 | Farnworth et al. |
| 6,245,444 B1 | | 6/2001 | Marcus et al. |
| 6,275,052 B1 | | 8/2001 | Hembree et al. |
| 6,278,286 B1 | | 8/2001 | Farnworth et al. |
| 6,292,007 B1 | | 9/2001 | Potter |
| 6,310,484 B1 | | 10/2001 | Akram et al. |
| 6,323,667 B1 | * | 11/2001 | Kazama .................... 324/761 |
| 6,326,799 B1 | | 12/2001 | Schein |
| 6,329,829 B1 | | 12/2001 | Farnworth et al. |
| 6,246,247 B1 | | 6/2002 | Eldridge et al. |
| 6,447,328 B1 | * | 9/2002 | Feldman ................... 439/482 |
| 2001/0000947 A1 | | 5/2001 | Swart et al. |

* cited by examiner

Primary Examiner—Kamand Cuneo
Assistant Examiner—Jimmy Nguyen
(74) Attorney, Agent, or Firm—Chase Law Firm, L.C.

(57) ABSTRACT

A spring probe having a barrel, plunger and a back-drilled aperture is provided in which the centerline axis of the aperture is separate from the longitudinal axis of the plunger. A portion of the spring force directed along the longitudinal axis of the probe is transferred to a side force to bias the plunger against the barrel for electrical contact. The lighter, more uniform biasing and slight rotation/agitation of the plunger within that barrel increases the probe life and electrical performance.

18 Claims, 4 Drawing Sheets

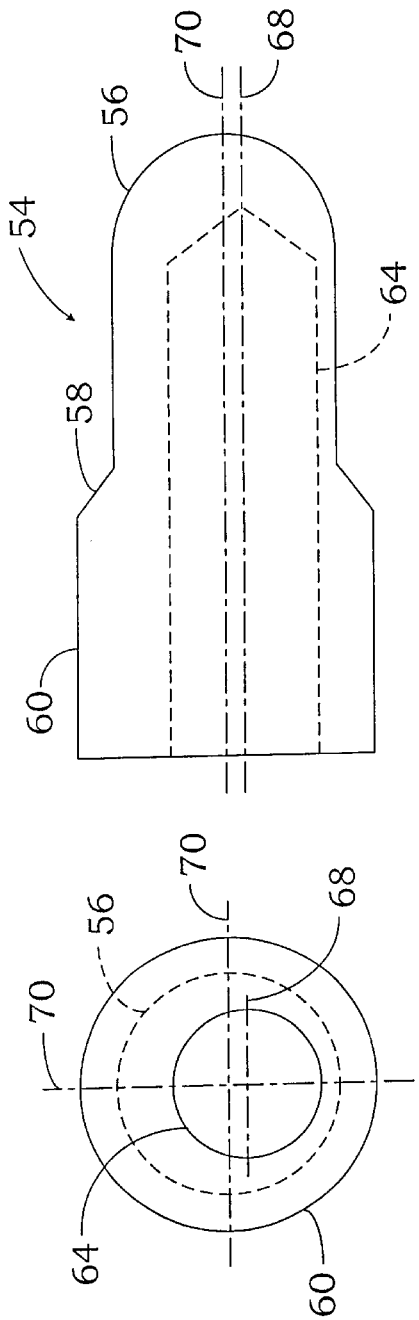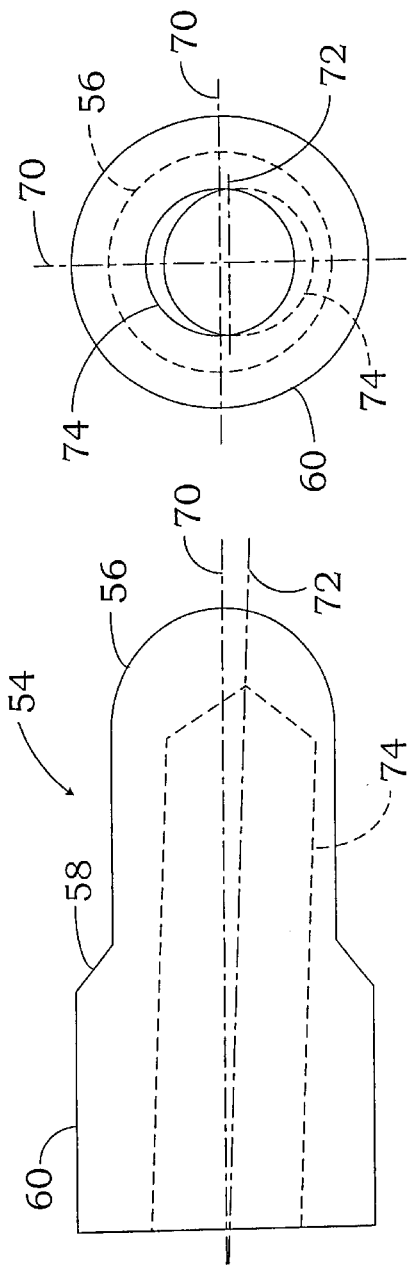
Fig. 4
Fig. 5
Fig. 6
Fig. 7

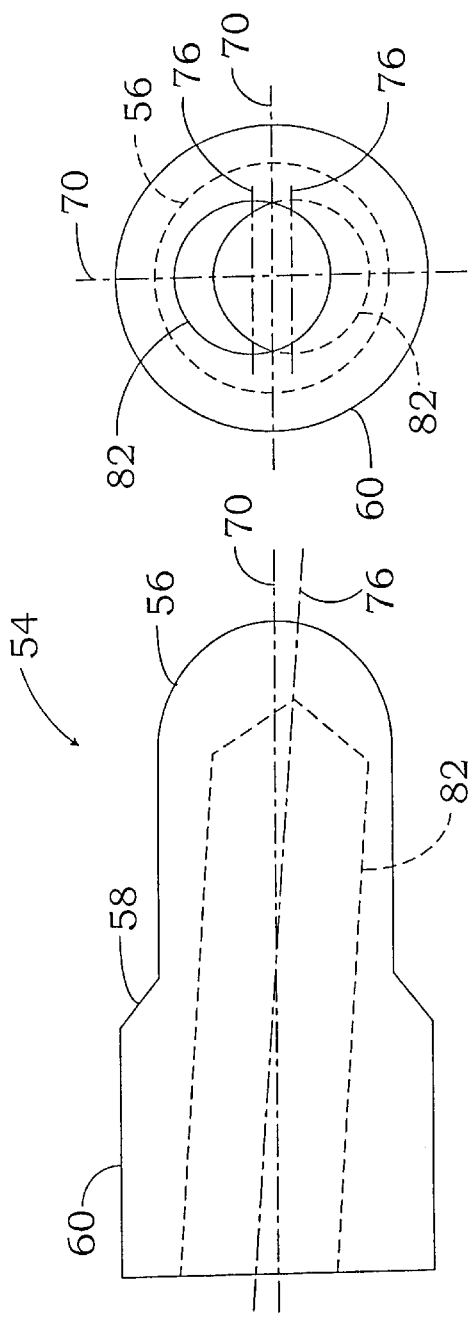
Fig. 8
Fig. 9
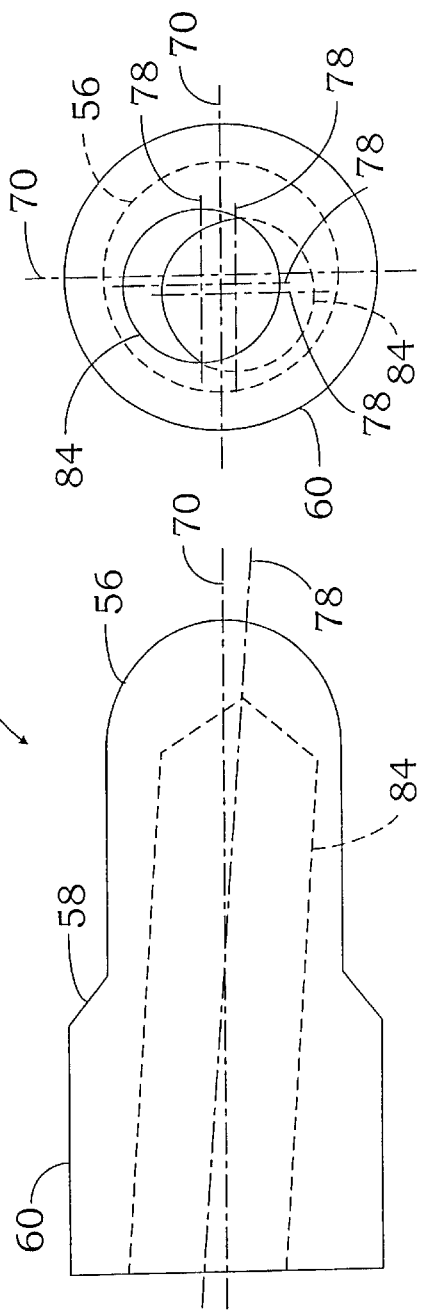
Fig. 10
Fig. 11

CONTACT PROBE WITH OFF-CENTERED BACK-DRILLED APERTURE

BACKGROUND OF THE INVENTION

This invention relates generally to battery-type contacts and interconnect probes and, in particular, to spring-loaded contact probes and a method for biasing the probes which are used in electrical testing applications and battery contact applications.

Conventional spring-loaded electrical contact probes generally include an outer receptacle, a barrel containing a movable plunger and a spring, which exerts a force against the back of the plunger to bias the plunger outwardly against the barrel. The plunger may be depressed inwardly of the barrel a predetermined distance, under force directed against the spring.

Battery-type contacts and interconnect probe designs generally require compact, durable, highly reliable designs with circuit paths optimized for the best performance. These contacts are typically employed in battery charging applications, mobile telecommunication applications, docking applications, and other portable electronic devices in addition to applications for testing electronics, printed circuit boards and computer chips, for example. They may be used as either power conductors or as signal carriers and would be subject to a variety of environmental conditions.

As products continue to shrink in size or increase in performance while maintaining current size, the need for smaller contacts continues to grow. Compliancy of a probe contact though continues to be important to accommodate the tolerances of many parts in an assembly. Many times this compliancy requires a probe with a plunger travel much longer than a spring can supply in the spaced allotted. This is compensated by back drilling the plunger to supply additional space for the spring. The resultant probe performs well mechanically but the electrical performance in certain instances is compromised by the action of the spring and device under test. Specifically, if the device under test pushes directly down on top of the plunger and the spring generates a force pushing directly up the desired contact between plunger and barrel, which is required for optimal electrical performance, can be very light or nonexistent. The result is a poor, unreliable electrical performance for the probe.

As is known in the art, current travels in parallel down all available paths in a quantity dependent upon the path's resistance. A spring, by nature of its design, has a very large resistance and will cause poor performance if it is the main circuit path. Likewise, large resistances between the barrel inner diameter ("ID") and plunger, referred to as the contact resistance, will also lead to poor performance or failure. Large contact resistances are generally due to low contact force between barrel ID and plunger, poor conductive material of barrel and plunger including plating material and contaminates such as dirt, lint, or even some lubricants. Good probe designs minimize the contact resistance by proper material selection, plating selection, attention to cleanliness/handling, and increasing the contact force between barrel ID and plunger through efforts called biasing, which is the action of forcing the plunger's bearing surface against the barrel ID.

In an effort to improve biasing in probes many designs have been generated. The most popular and successful has been applying a "bias cut" on the tail of the plunger. A large side force is created from the spring pushing against the bias cut creating firm, constant contact force between barrel and plunger. This contact force ensures that the current will flow from the plunger to the barrel and not through the spring and also provides the lowest contact resistance between barrel and plunger. The disadvantage to this type of design is the higher friction that is created between plunger and barrel resulting in failure of the probe due to mechanical wear.

With a back-drilled plunger, an angled surface cannot be generated to induce this biasing. Thus, other techniques must be employed to generate the biasing. Some techniques involve changing the plunger design on the front end to promote biasing while others require special barrels, tangs and such.

SUMMARY OF THE INVENTION

The present invention is a plunger with back-drilled hole or aperture with the centerline of the aperture separate from the plunger's longitudinal axis. The spring force against the plunger is no longer directly in line with the plunger longitudinal axis or centerline. When the plunger encounters the device under test or battery contact, for example, an immediate coupling or moment is created which transfers a portion of the longitudinal force exerted along the plunger axis into a side force. This moment creates the biasing needed by forcing the plunger's bearing surface against the barrel inner diameter. The pivot point is the contact point between plunger and device under test. The larger the spring force, the larger the moment and thus, the higher the contact force.

Some spring movement or "snaking" occurs due to the off-centered hole. The ends of the spring will tend to center themselves in the cavities made for them. Being that the two cavities are not aligned, the spring has no choice but to bend in the center of the coils. This bending action further amplifies the biasing of the plunger if the plunger cavity extends to the center of the spring.

An additional advantage of this design is that the force between plunger and barrel will not be as large as a normal biased plunger and will result in longer life through less wear. In a normal biased design the wear is localized between the plunger and barrel due to the severe biasing of the plunger. This new design with a less aggressive biasing, spreads the wear more evenly across the contact points of the barrel and plunger thereby reducing wear and increasing the life of the probe. Additionally, a slight random rotation of the plunger in the barrel due to the spring action further spreads and reduces the wear.

BRIEF DESCRIPTION OF THE DRAWINGS

FIG. 4 is a diagrammatic left end view, along line 4—4, of the plunger end of FIG. 3;

FIG. 5 is a partial diagrammatic side view of the plunger of FIG. 3 having an aperture with a centerline axis generally parallel to the longitudinal axis of the plunger;

FIG. 6 is a partial diagrammatic side view of another embodiment of the plunger of FIG. 5 having an aperture with a centerline axis which diverges from the longitudinal axis of the plunger;

FIG. 7 is a diagrammatic left end view of the plunger of FIG. 6;

FIG. 8 is a partial diagrammatic side view of another embodiment of the plunger of FIG. 5 having an aperture with a centerline axis which intersects the longitudinal axis of the plunger;

FIG. 9 is a diagrammatic left end view of the plunger of FIG. 8;

FIG. 10 is a partial diagrammatic side view of another embodiment of the plunger of FIG. 5 having an aperture with a centerline axis which is not coplanar with the longitudinal axis of the plunger;

FIG. 11 is a diagrammatic left end view of the plunger of FIG. 10;

DESCRIPTION OF THE PREFERRED EMBODIMENT

Figure 1:
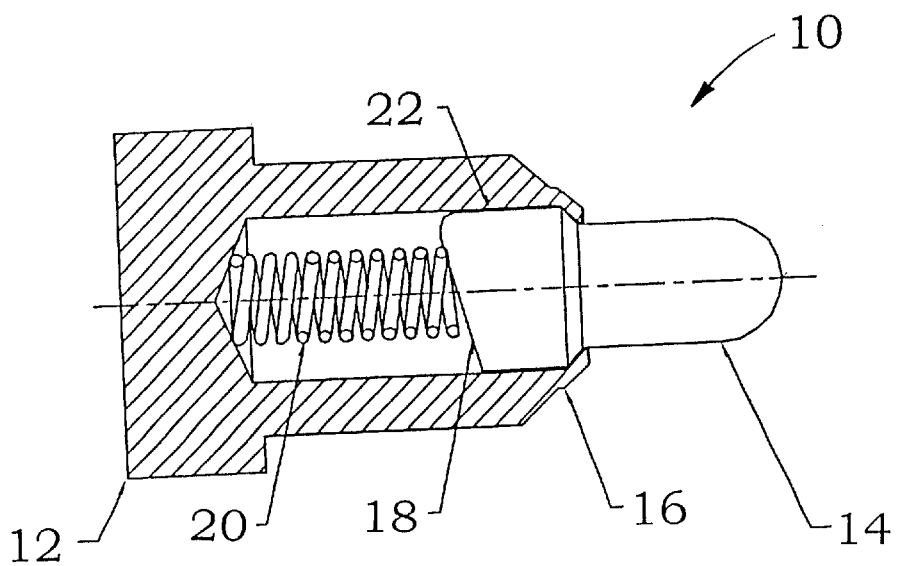
FIG. 1 is a side elevation sectional view of a prior art spring probe with a bias cut plunger.

FIG. 1 illustrates a prior art electrical contact probe 10. Prior art probe 10 includes a barrel 12 for receiving a plunger 14. A crimp 16 in barrel 12 retains plunger 14 within barrel 12. A bias cut 18 on the tail of plunger 14 is provided to create a transaxial force from a spring 20 pushing against the bias cut 18 and forcing plunger 14 against the inside diameter 22 of barrel 12. The contact force between plunger 14 and barrel 12 provides an electrical path between the barrel and plunger. The angled surface 18 creates a bend in spring 20 causing the spring to rub against the inside of the barrel 12, which reduces the life of the spring and increases the wear on the inside diameter 22 of the barrel 12.

Figure 2:
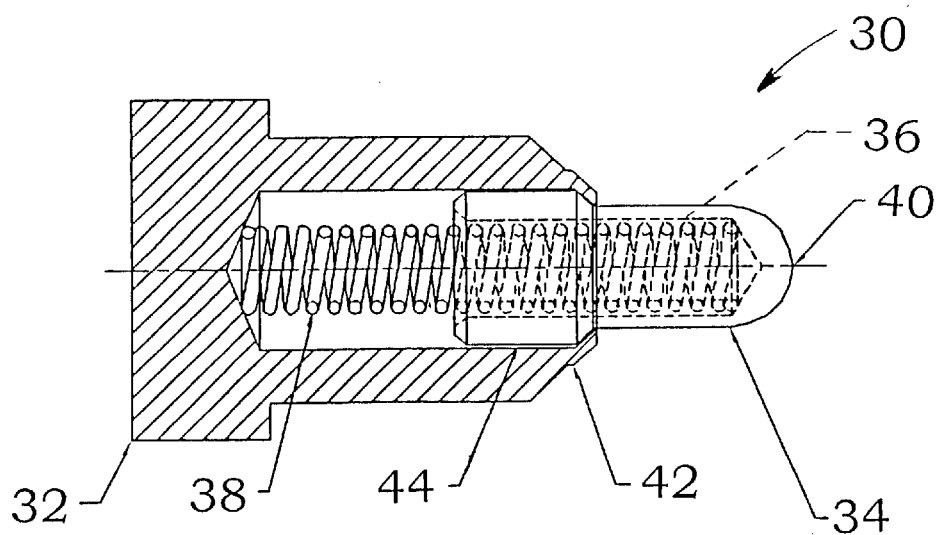
FIG. 2 is a cross-sectional side view of a prior art spring probe with a back-drilled plunger.

FIG. 2 illustrates a prior art conventional back-drilled electrical contact probe 30. Probe 30 includes a barrel 32 for receiving a plunger 34. Plunger 34 includes a back-drilled hole as indicated by reference numeral 36 to receive a spring 38. Hole 36 is drilled coincident with the centerline axis 40 of plunger 34. A crimp 42 retains plunger 34 within barrel 32. Contact between the plunger 34 and barrel 32 is intermittent along the inner surface 44 of barrel 32.

Figure 3:
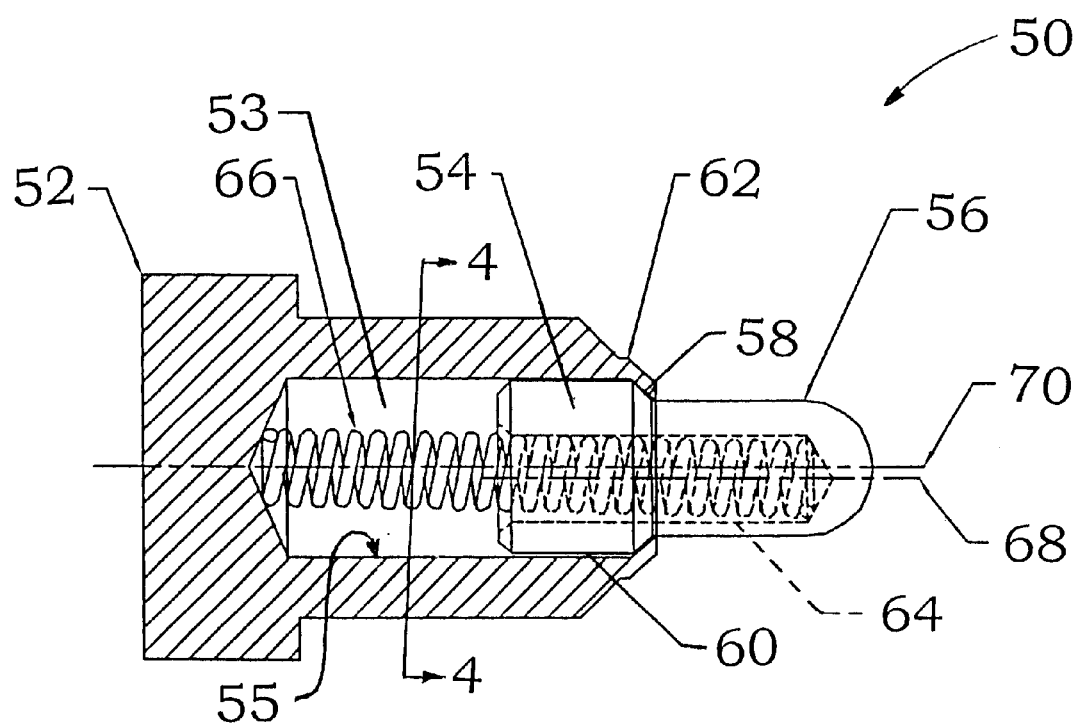
FIG. 3 is a cross-sectional side view of a spring probe of the present invention having a plunger with an eccentric back-drilled hole.

FIGS. 3–5 illustrate the electrical contact probe of the present invention generally indicated by the reference number 50. Probe 50 includes a hollow barrel 52 for receiving a plunger 54. Plunger 54 includes a top 56, shoulder or flange 58 and end portion 60. Plunger 54 is generally circular in cross-section having a diameter that diminishes from the end portion 60 to the tip 56 across flange 58. Crimp 62 in barrel 52 retains plunger 54 within barrel 52.

Plunger 54 includes a back-drilled hole or aperture 64 to receive a spring 66. In the preferred embodiment, the centerline axis 68 of aperture 64 is generally parallel to the longitudinal axis or centerline axis 70 of plunger 54 and cavity 53. Because aperture 64 does not share a common axis with plunger 54 and cavity 53, spring 66 bends slightly as its ends center themselves in cavity 53 and aperture 64. The spring force is not directly in line with the plunger centerline 70, thus when the plunger 54 encounters a device under test or battery contact, for example, an immediate coupling or moment of force is created. The moment transfers a portion of the axial force exerted on the plunger 54 by the spring 66, into a side or transaxial force generally perpendicular to the longitudinal axis 70 of plunger 54. This moment or torque creates the biasing by forcing the plunger's bearing surface (the outside surface of end 60) against the inner diameter 55 of barrel cavity 53. The pivot point for the moment is the tip 56 of the plunger 54 or the contact point between the plunger 54 and the device under test or electrical device. The larger the spring force the larger the moment created which in turn creates a higher contact force between the plunger 54 and barrel 52.

The biasing or contact between the barrel 52 and plunger 54 is necessary for good electrical conduction between the barrel 52 and plunger 54. However, contact between the surfaces also causes probe 50 to wear and may eventually fail. In addition to the moment created by the slight bend in spring 66, the off-centered aperture 64 induces the spring 66 to snake or rotate in the cavity 53 and aperture 64 causing plunger 54 to rotate slightly within cavity 53. This slight rotation allows the contact area between plunger 54 and barrel 52 to change as the probe 50 is used. Thus the wear is spread over a larger area resulting in an increased probe life. It should be appreciated that the slight rotation of plunger 54 within barrel 52 may be somewhat random depending on the amount the spring 66 is compressed and the spring force.

Referring to FIGS. 6 and 7, another embodiment of a plunger 54 is shown. Plunger 54 is physically the same as the plunger shown in FIGS. 3–5, having a tip 56, shoulder 58 and end portion 60, with the exception that centerline 72 of hole 74 is not generally parallel to the axis of rotation 70 of plunger 54. Hole 74 extends from the center of end portion 60 at a slight angle to centerline 70 toward the tip 56 of plunger 54.

Because hole 74 does not share a centerline axis with plunger 54 and cavity 53, spring 66 bends slightly as its ends center themselves in cavity 53 and hole 74 (see FIG. 3 for barrel cavity 53 and spring 66 configuration). The spring force is not in line with plunger centerline 70, thus when the plunger 54 encounters a device under test, an immediate coupling or moment is created biasing the plunger against the inner diameter of barrel cavity 53. Compression of spring 66 causes slight rotation or agitation of the plunger 54 within cavity 53 of barrel 52.

Referring to FIGS. 8–13, three additional embodiments are shown for plunger 54. In each of these embodiments the centerlines 76, 78 and 80 of apertures 82, 84 and 86, respectively, are generally not parallel to the longitudinal axis 70 of plunger 54. As shown in FIGS. 8 and 9, centerline 76 of aperture 82 begins above longitudinal axis 70 on the left side of FIG. 8, intersects axis 70 at approximately the mid-point of plunger 54 and ends at below axis 70 on the right side of FIG. 8. In the embodiment shown in FIGS. 8 and 9, the centerline axis 76 of aperture 82 is coplanar with plunger longitudinal axis 70.

Referring to FIGS. 10 and 11, centerline axis 78 of aperture 84 is not coplanar with longitudinal axis 70 of plunger 54. In this embodiment, aperture 84 is drilled, for example, off center and at a slight angle with respect to longitudinal axis 70.

It is to be understood that while certain forms of this invention have been illustrated and described, is it not limited thereto except insofar as such limitations are included in the following claims.

Having thus described the invention, what is claimed as new and desired to be secured by Letters Patent is as follows:

1. An electrical contact spring probe assembly for communication with an electrical component comprising:

a plunger having a contact tip and an end portion opposite said contact tip, a tubular barrel for receiving said end portion for movement of said plunger along a longitudinal axis between an extended position where said tip projects from said barrel and a withdrawn position where said tip partially retracts within said barrel, said plunger having a longitudinally extending aperture therein defining a second axis separate from said longitudinal axis, and a spring for applying a longitudinal load on said plunger and having a first end engaging said barrel and a second end received within said aperture to translate a portion of said longitudinal load into a side load to bias said plunger against said barrel.

2. The spring probe as claimed in claim 1 wherein said spring applies a torque about said longitudinal axis of said plunger to rotate said plunger.

3. The spring probe as claimed in claim 2 wherein said plunger rotates about said longitudinal axis when said plunger moves between said retracted position and said extended position.

4. The spring probe as claimed in claim 1 wherein said second axis is generally parallel to said longitudinal axis.

5. The spring probe as claimed in claim 1 wherein said second axis intersects said longitudinal axis.

6. The spring probe as claimed in claim 1 wherein said second axis is generally coplanar with said longitudinal axis.

7. An electrical contact spring probe for communication with an electrical device comprising:

a plunger having an end portion, a longitudinal axis and an aperture in said end portion having a centerline axis separate from said longitudinal axis symmetry, a tubular barrel for receiving s aid end portion of said plunger, and a spring having a first end positioned within said barrel and a second end positioned within said aperture for biasing said plunger against said barrel.

8. The spring probe as claimed in claim 7 wherein said spring applies a torque about said longitudinal axis of said plunger to rotate said plunger.

9. The spring probe as claimed in claim 8 wherein said plunger rotates about said longitudinal axis when said plunger moves between said retracted position and said extended position.

10. The spring probe as claimed in claim 7 wherein said second axis is generally parallel to said longitudinal axis.

11. The spring probe as claimed in claim 7 wherein said second axis intersects said longitudinal axis.

12. The spring probe as claimed in claim 7 wherein said second axis is generally coplanar with said longitudinal axis.

13. An electrical contact spring probe for communication with an electrical component comprising:

a plunger having a contact tip, an end portion opposite said contact tip, a longitudinal axis, and an aperture in said end portion having a centerline axis separate from said longitudinal axis and extending generally towards said contact tip, a barrel for receiving and retaining said end portion of said plunger, and having an interior surface, and a spring for applying an axial force on said plunger and having a first end engaging said barrel and a second end received within said aperture, said aperture for transferring a portion of said axial force into a transaxial force to bias said end portion of said plunger against a portion of said interior surface of said barrel.

14. The spring probe as claimed in claim 13 wherein said spring applies a torque about said longitudinal axis of said plunger to rotate said plunger.

15. The spring probe as claimed in claim 14 wherein said plunger rotates about said longitudinal axis when said plunger moves between said retracted position and said extended position.

16. The spring probe as claimed in claim 13 wherein said second axis is generally parallel to said longitudinal axis.

17. The spring probe as claimed in claim 13 wherein said second axis intersects said longitudinal axis.

18. The spring probe as claimed in claim 13 wherein said second axis is generally coplanar with said longitudinal axis.

* * * * *

UNITED STATES PATENT AND TRADEMARK OFFICE
CERTIFICATE OF CORRECTION

PATENT NO.    : 6,696,850 B1
DATED         : February 24, 2004
INVENTOR(S)   : David L. Sanders It is certified that error appears in the above-identified patent and that said Letters Patent is hereby corrected as shown below:

Column 5,
Line 24, delete "s aid" and substitute -- said --.

Signed and Sealed this

Sixth Day of July, 2004

JON W. DUDAS
*Acting Director of the United States Patent and Trademark Office*